(12) United States Patent
Weygan et al.

(10) Patent No.: US 6,271,109 B1
(45) Date of Patent: Aug. 7, 2001

(54) SUBSTRATE FOR ACCOMMODATING WARPED SEMICONDUCTOR DEVICES

(75) Inventors: Teddy D. Weygan; Ferdinand B. Arabe; Ronaldo M. Arguelles, all of Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/620,852

(22) Filed: Jul. 21, 2000

Related U.S. Application Data

(60) Provisional application No. 60/145,767, filed on Jul. 27, 1999.

(51) Int. Cl.⁷ .................................................. H01L 21/44
(52) U.S. Cl. ........................ 438/612; 438/613; 438/614; 438/615
(58) Field of Search ................................. 438/612, 613, 438/614, 615

(56) References Cited

U.S. PATENT DOCUMENTS

| | | | |
|---|---|---|---|
| 5,525,834 | * 6/1996 | Fischer et al. | 257/691 |
| 5,701,032 | * 12/1997 | Fischer et al. | 257/692 |
| 5,919,329 | * 7/1999 | Banks et al. | 156/281 |
| 6,020,221 | * 2/2000 | Lim et al. | 438/125 |
| 6,083,820 | * 7/2000 | Farrnworth | 438/614 |
| 6,111,313 | * 8/2000 | Kutlu | 257/697 |
| 6,117,352 | * 9/2000 | Weaver et al. | 216/105 |
| 6,117,695 | * 9/2000 | Murphy et al. | 438/15 |

\* cited by examiner

Primary Examiner—John F. Niebling
Assistant Examiner—Lynne A. Gurley
(74) Attorney, Agent, or Firm—Gary C. Honeycutt; Fred Telecky; Arthur I. Navarro

(57) ABSTRACT

A substrate for solder ball assembling a semiconductor device substantially parallel onto said substrate, said device having a plurality of terminals arrayed on a warped surface, comprising an electrically insulating surface including a plurality of discrete metallic areas; said areas having locations matching the locations of said device terminals, and further being suitable for solder ball attachment in surface mount reflow operation; and said areas further having at least one characteristic suitable for accommodating said device warping in solder reflow operation, whereby areas having higher amounts of said characteristic cause said solder balls to become thinner during reflow, resulting in lower solder joint heights, relative to the heights of the remaining solder joints.

4 Claims, 3 Drawing Sheets

SOLDER VOLUME $(V_0)$ = SOLDER VOLUME $(V_1)$   (1)

$$V_1 = \pi \left[ R_1 \left( R_1^2 - \frac{L_1^2}{4} \right) - \frac{\left( R_1^2 - \frac{L_1^2}{4} \right)^{\frac{3}{2}}}{3} + \frac{2}{3} R_1^3 + \frac{L_1^2}{4} D_1 \right] \quad (2)$$

SOLDER HEIGHT $(H_1)$ + COPLANARITY $(C)$ = SOLDER HEIGHT $(H_0)$   (3a)   FIG. 4

$$C + \sqrt{R_1^2 - \frac{L_1^2}{4}} + R1 = \sqrt{R_0^2 - \frac{L_0^2}{4}} + R_0 \quad (3b)$$

$$\sqrt{R_1^2 - \frac{L_1^2}{4}} + R1 = \text{CONSTANT } (k) \quad (4)$$

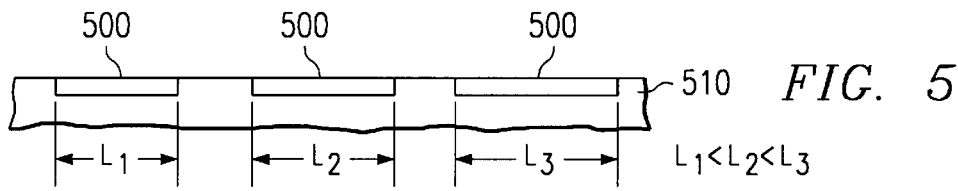

FIG. 5   $L_1 < L_2 < L_3$

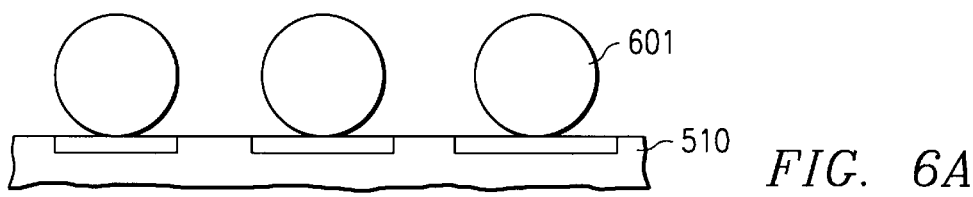

FIG. 6A

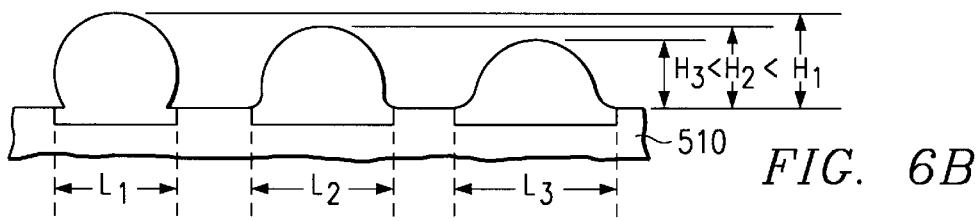

FIG. 6B   $H_3 < H_2 < H_1$

TYPICAL VALUES FOR THE 15×15 μ*BGA:
- $D_0 = 75$ μm
- $L_0 = 450$ μm
- $H_0 = 450$ μm
- $C = 100$ μm
- $L_1 = 590$ μm (APPROX)

TYPICAL VALUES FOR THE 12×12 μ*BGA:
- $D_0 = 75$ μm
- $L_0 = 375$ μm
- $H_0 = 450$ μm
- $C = 100$ μm
- $L_1 = 608$ μm (APPROX)

FIG. 7

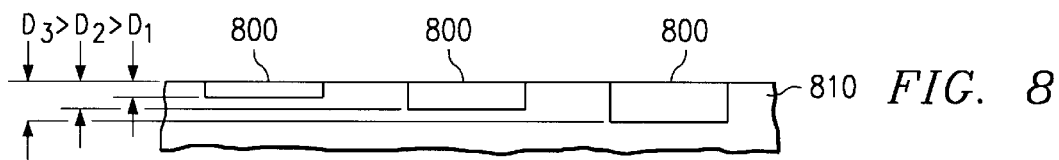
FIG. 8
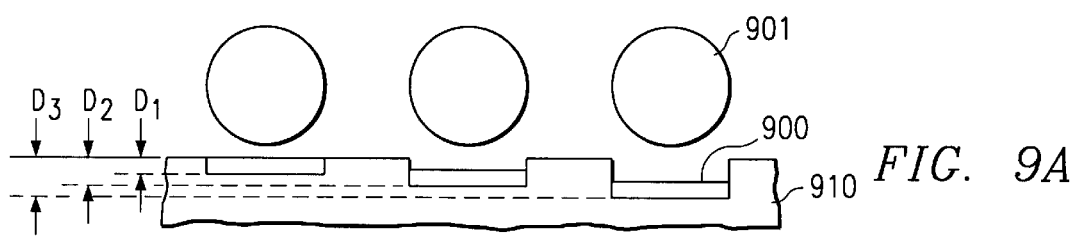
FIG. 9A
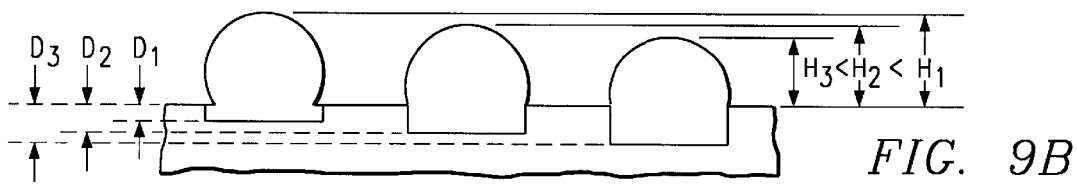
FIG. 9B
TYPICAL VALUES FOR THE 15×15 μ*BGA:
$D_0 = 75$ μm
$L_0 = 450$ μm
$H_0 = 450$ μm
$C = 100$ μm
$D_1 = 175$ μm (APPROX)
TYPICAL VALUES FOR THE 12×12 μ*BGA:
$D_0 = 75$ μm
$L_0 = 375$ μm
$H_0 = 450$ μm
$C = 100$ μm
$D_1 = 165$ μm (APPROX)
FIG. 10

SUBSTRATE FOR ACCOMMODATING WARPED SEMICONDUCTOR DEVICES

This application claims the benefit of Provisional No. 60/145,767 filed Jul. 27, 1999.

FIELD OF THE INVENTION

The present invention is related in general to the field of semiconductor devices and processes and more specifically to structures, materials and fabrication of substrates to be used in surface mount assembly of semiconductor devices.

DESCRIPTION OF THE RELATED ART

In order to successfully attach a leaded semiconductor surface mount device onto a board by soldering, all the device leads have to touch the board surface simultaneously, or at least be within a certain small distance from that surface; they have to exhibit "coplanarity". The coplanarity is a function of the lead pitch. As an example of industry practice, for a lead pitch of 0.65 mm, the acceptable coplanarity is 0.1 mm, representing a tolerance window of ±0.05 mm. For a lead pitch of 0.3 mm, the acceptable coplanarity is only 0.05 mm (for comparison, the diameter of a human hair falls into the 0.1 to 0.3 mm range).

With the advent of the Ball Grid Array (BGA) package for semiconductor devices, the coplanarity of leaded devices is no longer an issue, since the leads are replaced by solder "balls" for surface mount assembly. However, in plastic BGA's, the overall packages are usually somewhat flexible, since they are composed of flexible materials. There is typically a significant difference in the coefficients of thermal expansion between the silicon chip, the plastic substrate used for chip mounting, and the encapsulation material (commonly a plastic molding compound). Consequently, in processes at elevated temperatures, the package may slightly warp and then represent, as a whole package, coplanarity problems in subsequent assembly processes. Due to the warping and coplanarity problem, only a limited number of solder balls attached to the warped package surface will contact the board in assembly, while a substantial number of solder balls will not contact the board surface and will not be able to form solder joints in solder reflow attach processes.

Typically, assembly and packaging processes at elevated temperatures include:

Transfer molding at 175° C. in less than 1 minute.

Polymerization of the molded device at 175° C. for up to six hours in "cure" ovens.

Reflow of attached solder balls or bumps. Typically, solder bumps are reflowed in chain type furnaces at temperatures dependent on the melting of the solder mixture (typically between about 150 and 250° C.).

After these temperature treatments, plastic BGA packages may exhibit warping to the extent that uniform solder ball attachment onto substrates is difficult, if not outright impossible. The resultant coplanarity problems are particularly pronounced for BGA packages using plastic films or other thin plastic materials as supporting parts. As a consequence, serious yield losses and reliability problems have been encountered in board attach processes of plastic BGA's.

The proposal to remedy the coplanarity problem by using an array of solder balls having different diameters dependent on the location on the package, is completely impractical; in addition, the degree of warping varies with device type, size and materials of packages, thermal process history, and so on. As an example, in BGA's having a convex warping, this proposal would require smaller diameter solder balls for the center portion of the package and larger diameter balls for the peripheral portions—a proposition which mass manufacturing would have great difficulties in handling.

An urgent need has therefore arisen for a low-cost and reliable approach, involving both package and board structures and the assembly fabrication method, to provide uniform board attachment of warped plastic Ball Grid Array packages, with the goal of assembling the plastic BGA device substantially parallel to the substrate. The structure of the substrate and the assembly method should be flexible enough to be applied for different semiconductor product families and a wide spectrum of design and assembly variations, and should achieve improvements towards the goals of enhanced process yields and device reliability. Preferably, these innovations should be accomplished using the installed equipment base so that no investment in new manufacturing machines is needed.

SUMMARY OF THE INVENTION

According to the present invention for a semiconductor integrated circuit (IC) assembly, a Ball Grid Array (BGA) package with the solder balls arrayed on a warped surface can be attached substantially parallel onto a flat substrate when the substrate has contact areas featuring at least one distributed characteristic to cause the solder balls to become thinner during reflow. One such distributed characteristic may be the size of the contact areas. Another such feature may be the metallic thickness of the areas. Most frequently, the warped surface has an outward concave contour, but the invention applies also to convex BGA surface contours.

The present invention is related to high density ICs packaged as plastic BGA's, especially those having high numbers of inputs/outputs, and also to low end, low cost devices. These ICs can be found in many semiconductor device families such as standard linear and logic products, digital signal processors, microprocessors, digital and analog devices, high frequency and high power devices, and both large and small area chip categories.

It is an aspect of the present invention to provide a substrate with solder contact areas having at least one characteristic which exploits the wetting of solder on metallic surfaces, the dissolving strength of liquid solder, and the self-aligning feature of liquid solder surfaces based on surface tension.

Another aspect of the present invention is to design these characteristics so that certain categories of substrates match certain BGA package types having their known statistical degree of warping.

Another aspect of the invention is to reach these goals without cost of equipment changes and new capital investment and using the installed fabrication equipment base.

Another aspect of the invention is to teach guidelines for designing the substrate contact areas in order to match the corrective characteristic to the statistical coplanarity distribution of the BGA-to-be-assembled.

These aspects have been achieved by the teachings of the invention concerning the structure, geometries and material selection of the substrates, and the assembly methods suitable for mass production. Various modifications have been successfully employed.

In the first embodiment of the invention, the sizes of the metallic substrate areas are modified to accommodate a BGA package with concave warping of its solder ball surface. The resultant lowering of the solder joint heights and resolved coplanarity problem are illustrated.

In the second embodiment of the invention, the metallic thickness and solder-dissolving characteristic of the substrate contact areas are modified to accommodate a BGA package with concave warping of its solder ball surface. The resultant lowering of the solder joint heights and resolved coplanarity problem are illustrated.

The technical advances represented by the invention, as well as the aspects thereof will become apparent from the following description of the preferred embodiments of the invention, when considered in conjunction with the accompanying drawings and the novel features set forth in the appended claims.

BRIEF DESCRIPTION OF THE DRAWINGS

FIG. 4 lists mathematical equations expressing the interrelation of the parameters in FIG. 3.

FIGS. 5 to 7 illustrate schematically the first embodiment of the invention.

FIG. 5 is a simplified cross section through a portion of a substrate characterized by metallic contact areas of various sizes.

FIGS. 6A and 6B are simplified cross sections through the contact areas of FIG. 5 before and after solder ball reflow.

FIG. 7 lists numerical examples of BGAs featuring the first embodiment of the invention.

FIGS. 8 to 10 illustrate schematically the second embodiment of the invention.

FIG. 8 is a simplified cross section through a portion of a substrate characterized by metallic contact areas of various thicknesses.

FIGS. 9A and 9B are simplified cross sections through the contact areas of FIG. 8 before and after solder ball reflow.

FIG. 10 lists numerical examples of BGAs featuring the second the second embodiment of the invention.

DETAILED DESCRIPTION OF THE PREFERRED EMBODIMENTS

Figure 1:
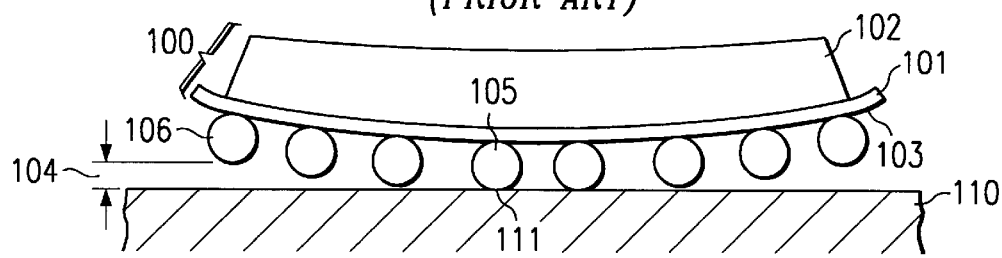
FIG. 1 is a schematic and simplified cross section of a BGA device with coplanarity problem, to be attached to a substrate.

As illustrated in FIG. 1, the invention relates to the assembly of an integrated circuit (IC), packaged in a plastic Ball Grid Array (BGA) package 100, onto a flat substrate 110 in solder reflow process. Because of the mismatch of the coefficients of thermal expansion of the semiconductor chip and the mostly plastic parts (including carrier 101 and encapsulant 102) of the package, the BGA package frequently deviates from a flat shape and may, for instance, exhibit a convex surface curvature 103.

As defined herein, the difference in elevation between BGA solder "balls" touching the substrate surface and BGA "balls" not touching the surface due to package warping, is called BGA "coplanarity". In FIG. 1, solder balls 105 touch the substrate surface at places 111; however, solder balls 106 do not touch the substrate surface. In devices having a warping problem with a convex surface, the coplanarity reaches a maximum value C, designated 104 in FIG. 1, for solder balls positioned at the BGA perimeter.

As defined herein, the term "ball" is used to refer to a finite body of material. In addition, it may often but by no means always have the additional connotation of approximately spherical shape. When used in conjunction with solder material after reflow, this finite body of material may rather have the shape of a half-dome, a truncated cone, or a cylinder with straight, concave or convex outlines. It is still referred to as a "ball".

Figure 2:
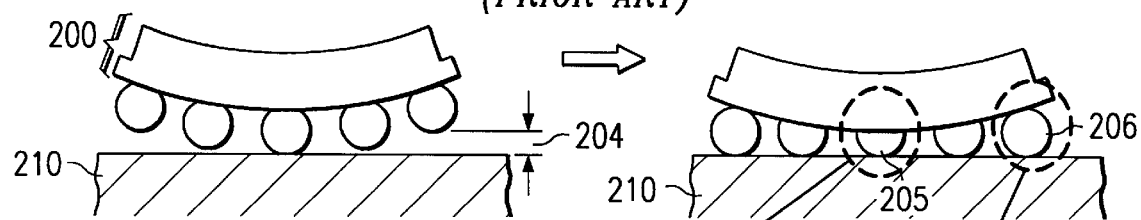
FIG. 2 is a schematic and simplified cross section of a BGA device with coplanarity problem and its assembly, substantially parallel, onto a substrate.

The present invention relates to methods of assembling by solder reflow a warped BGA 200 in FIG. 2, having the maximum coplanarity 204, onto a flat substrate 210. During assembly, all solder balls have to undergo reflow and will have to result in different solder joint heights dependent on the position of the solder ball on the warped BGA surface. In the warped BGA of FIG. 2 having a convex surface, balls 205 show a lower solder joint height compared to balls 206 around the perimeter of the package.

By way of example, BGAs with small outlines (for instance, $\mu$*BGA™), have square shape of 12×12 mm and solder balls numbering 100, 128, 144, or 180; square shape of 15×15 mm and solder balls numbering 176 or 196; solder ball diameter after reflow typically 450 $\mu$m. In other devices, solder ball diameters may be smaller, as in the diameter range of about 100 to 120 $\mu$m, or may be considerably larger.

Figure 3:
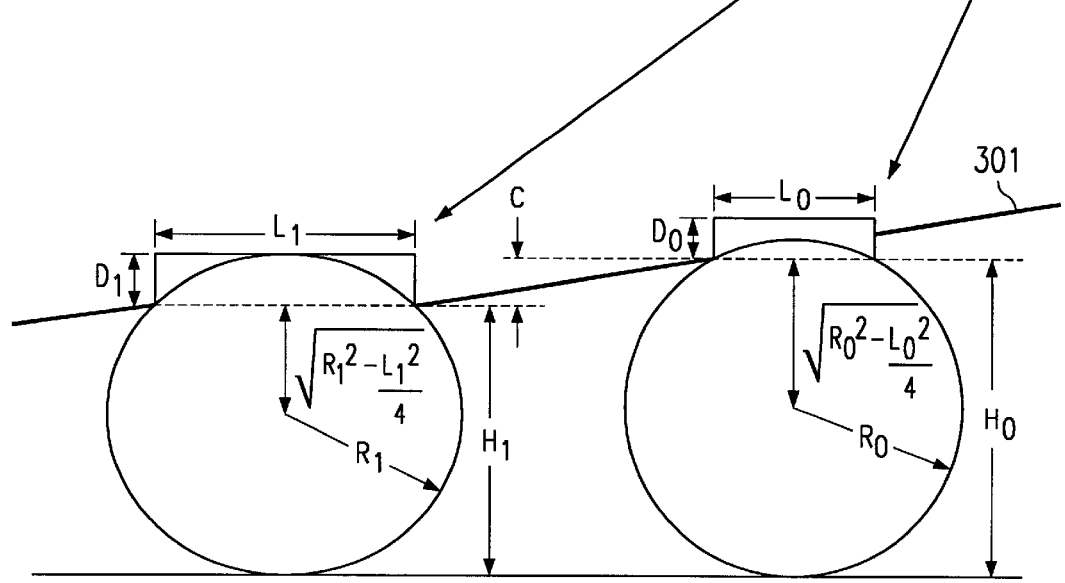
FIG. 3 is a mathematical description of the conditions for assembly of a BGA with coplanarity problem, substantially parallel to a flat substrate.

Using the warped BGA after solder reflow of FIG. 2 as a guideline, FIG. 3 derives the mathematical relations between coplanarity C and the extreme cases of solder ball distribution in order to accommodate the device warping. Solder ball cases with tall solder joint height (designated 206 in FIG. 2), are indicated in FIG. 3 by subscripts "o": Solder ball of height Ho and radius Ro for contact length Lo over contact depth Do. Solder ball cases with low solder joint height (designated 205 in FIG. 2), are indicated by subscripts "1": Solder ball of height H1 and radius R1 for contact length L1 over contact depth D1. In FIG. 3, the warped surface is indicated by heavy line 301.

The results of the mathematical model are summarized in FIG. 4 based on two relations which characterize BGA solder reflow operations: First, solder volumes Vo and V1 are identical, since no material is lost or created in the assembly process (equation (1)). Second, the taller solder height Ho is the sum of the smaller solder height H1 plus the coplanarity C (equations (3a) and (3b)), expressing the goal of substantially parallel assembly of BGA and substrate. Further, the volume of any solder ball is expressed in equation (2) in terms of solder ball radius and contact length and depth. For ease of calculations, the tacit assumption is made that the solder contacts on the substrate surface are identical.

In the actual assembly process, the solder contacts at the package joints are identical and the contacts on the substrate surface are variable. This does not affect the modeling results. As a consequence, the embodiments of the invention start with the design of the minimum length and minimum depth of the substrate contact areas. Based on typical fabrication practice, it is reasonable to let these minima be Lo and Do, as is also suggested by FIGS. 2 and 3. Fixing the minima and using equation (1) delivers equation (4). Consequently, the remaining variables are R1, L1, and D1. When L1 and D2 are designed, R2 will be determined as a consequence of equation (1). Designing L1 leads to the first embodiment of the invention; designing D1 leads to the second embodiment.

First Embodiment of the Invention: Discrete Lengths L1, L2, . . . , Ln

FIGS. 5 to 7 illustrate structure, materials and processes of the first embodiment of the present invention. The embodiment is based on variable sizes of the discrete metallic contact areas 500 of the substrate 510. The substrate is preferably made of electrically insulating organic material selected from a group consisting of polyimide, polymer strengthened by glass fibers, FR-4, FR-5, and BT resin. The substrate has a generally flat surface. Another option is a thermally conductive substrate (for instance, metal such as copper) with an insulating layer on top. Deposited on the surface, or inset in the surface, are contact areas 500, usually consisting of copper with a flash of gold. However, if metal interdiffusion with the solder is to be kept at a minimum, a thin layer of refractory metal (titanium or titanium-tungsten alloy, 40 to 700 nm thick, preferred 50 nm) may be deposited over the copper layer, followed by a layer of platinum or platinum-rich alloy (200 to 800 nm thick, preferred 500 nm). Other materials for the contact areas may be selected from a group consisting of aluminum, tungsten, or alloys thereof, overlaid by palladium or gold.

FIG. 5 schematically shows a portion of substrate 510 with three discrete metallic substrate areas of lengths L1, L2, and L3, respectively. Length L1 has the smallest value, length L3 the largest. The number of areas and the actual lengths are designed based on the model of FIGS. 3 and 4 in relation to the number of BGA solder balls and the degree of surface warping of the BGA to be assembled (see examples in FIG. 7 for a typical values L1).

FIGS. 6A and 6B display schematically the attachment of solder balls 601 (of approximately equal diameter) to the discrete substrate areas on substrate 510, the reflow of the solder balls 601 and the effect of the invention on the heights of the resulting solder joints. Solder balls 601 are selected from a group consisting of tin/lead, tin/indium, tin/silver, tin/bismuth, solder pastes, and conductive (for instance, silver-filled) adhesives. The solder alloy is selected based on its melting temperature convenient for the device application, and its capability to wet the contact surface completely. As FIG. 6A shows, the solder balls 601 are preferably of identical size, with the diameter varying widely dependent on device type and application; typical diameters are about 250 to 500 $\mu$m, other examples are quoted above.

FIG. 6B illustrates the fact that the solder balls of originally equal size spread at the reflow temperatures across the surface of the substrate contact areas and create solder joints of unequal heights H1, H2, H3. The tallest height H1 is related to the smallest length L1, the smallest height H3 to the longest length L3. Since the length of the substrate contact area is the characteristic variable in the first embodiment of the invention, this result indicates that higher amounts of the characteristic cause the solder balls to become thinner during solder reflow, relative to the thickness of the remaining solder joints. This, in turn, causes lower solder joint heights relative to the heights of the remaining solder joints.

FIG. 7 tabulates typical results based on two actual $\mu$*BGA™ geometrical data. The quoted values for L1 are averages over many L1, L2, . . . , Ln.

The heights H1, H2, . . . , Hn have been structured according to the empirical warping of the plastic BGA to be assembled on the board. Using the invention for the characteristics of substrate and reflow solder balls, warped semiconductor BGA packages can be accommodated.

Second Embodiment of the Invention: Discrete

Depths D1, D2, . . . , Dn

FIGS. 6 to 10 illustrate structure, materials and processes of the second embodiment of the present invention. The embodiment is based on variable depths of the discrete metallic contact areas 800 of the substrate 810. The substrate is preferably made of electrically insulating organic material selected from a group consisting of polyimide, polymer strengthened by glass fibers, FR-4, FR-5, and BT resin. The substrate has a generally flat surface. Another option is a thermally conductive substrate (for instance, metal such as copper) with an insulating layer on top. Inset into the surface are contact areas 800 of various depths D1, D2, D3, . . . , Dn. FIG. 8 shows these contact areas filled flat to the substrate surface with a material somewhat spongy (such as gold-clad aluminum sponge) or containing voids intended to be filled with solder. FIG. 9A shows these contact areas recessed to various depths, with a metal layer deposited in each recess (such as copper with a flash of gold). Other materials for the contact areas may be selected from a group consisting of aluminum, tungsten, or alloys thereof, overlaid by palladium, gold, platinum, or platinum-rich alloy.

FIGS. 8 and 9A schematically show a portion of substrate 810 and 910, respectively, with three discrete metallic substrate areas of depth D1, D2, and D3, respectively. D1 has the smallest value, D3 the largest. The number of areas and the actual depths are designed based on the model in FIGS. 3 and 4 in relation to the number of BGA solder balls and the degree of surface warping of the BGA to be assembled (see examples in FIG. 10 for typical values D1).

FIGS. 9A and 9B display schematically the attachment of solder balls 901 (of approximately equal diameter) to the discrete substrate areas on substrate 810 and 901, respectively, the reflow of the solder balls 901 and the effect of the invention on the heights of the resulting solder joints. The solder alloy is selected based on its melting temperature convenient for the device application, and its capability to penetrate the contact depths fully. Solder balls 901 are selected from a group consisting of tin/lead, tin/indium, tin/silver, tin/bismuth, solder pastes, and conductive (for instance, silver-filled) adhesives. The diameter of solder balls 901 may vary widely dependent on device type and application; typical diameters are about 250 to 500 $\mu$m.

FIG. 9B illustrates the fact that the solder balls of originally equal size penetrate at the reflow temperatures into the depth of the contact areas and create solder joints of unequal heights H1, H2, H3. The tallest height H1 is related to the shallowest depth D1, the smallest height H3 to the deepest depth D3. Since the depth of the substrate contact area is the characteristic variable in the second embodiment of the invention, this results indicates that the higher amounts of the characteristic cause the solder balls to become thinner during solder reflow, relative to the thickness of the remaining solder joints. This, in turn, causes lower solder joint heights relative to the heights of the remaining solder joints.

FIG. 10 tabulates typical results based on two actual $\mu$*BGA™ geometrical data. The quoted values for D1 are averages over many D1, D2, . . . , Dn.

The heights H1, H2, . . . , Hn have been structured according to the empirical warping of the plastic BGA to be assembled on the board. Using the invention for the characteristics of substrate and reflow solder balls, warped semiconductor BGA packages can be accommodated.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor material used in manufacturing. As another example, the BGA may have an encapsulation made by overmolding or another technique, or may have no encapsulation at all. The IC chip may be wire bonded or solder flip processed. It is therefore intended that the appended claims encompass any such modifications or embodiments.

We claim:

1. A method for assembling a semiconductor device having a plurality of terminals on a warped surface onto a substrate having an electrically insulating surface including a plurality of discrete metallic areas in locations matching the locations of said device terminals, said areas further having at least one characteristic suitable for accommodating said device warping, comprising the steps of:

forming an array of solder balls attached to said device terminals so that each terminal is contacted by one of said solder balls;

mechanically aligning said solder balls so that each solder ball is placed into alignment with one of said metallic areas on said substrate;

contacting said solder balls and said metallic substrate areas, as completely as permitted by said device surface warping;

applying energy such that said substrate and said device increase in temperature and transfer heat to said solder balls, causing said solder balls to reach a liquid state;

dwelling for metallurgical interaction, thereby activating said substrate area characteristic to cause said liquid solder balls to become thinner, resulting in lower solder joint heights, and to accommodate said device warping, resulting in device alignment substantially parallel to said substrate; and removing said energy such that said solder balls cool and harden, forming physical bonds between said solder balls and said metallic areas.

2. The method according to claim 1 wherein said energy is supplied uniformly while said substrate and said device move through an oven.

3. The method according to claim 1 wherein said substrate area characteristic is the size of said areas, causing said liquid solder to spread wider laterally by wetting and surface tension.

4. The method according to claim 1 wherein said substrate area characteristic is the metallic thickness of said areas, causing said liquid solder to penetrate deeper by metallic mixing.

* * * * *